United States Patent [19]

Kikuchi

[11] 4,253,888
[45] Mar. 3, 1981

[54] PRETREATMENT OF PHOTORESIST MASKING LAYERS RESULTING IN HIGHER TEMPERATURE DEVICE PROCESSING

[75] Inventor: Kazuya Kikuchi, Moriguchi, Japan

[73] Assignee: Matsushita Electric Industrial Co., Ltd., Kadoma, Japan

[21] Appl. No.: 47,241

[22] Filed: Jun. 11, 1979

[30] Foreign Application Priority Data

Jun. 16, 1978 [JP] Japan ............................... 53-73420
Nov. 20, 1978 [JP] Japan ............................. 53-143641
Nov. 20, 1978 [JP] Japan ............................. 53-143643

[51] Int. Cl.$^3$ ..................... H01L 21/26; B05D 3/06
[52] U.S. Cl. .................................. 148/187; 148/1.5; 156/643; 427/35; 427/43.1
[58] Field of Search ............... 148/1.5, 187; 427/35, 427/53, 316, 43.1; 156/643

[56] References Cited

U.S. PATENT DOCUMENTS

| | | | |
|---|---|---|---|
| 3,799,777 | 3/1974 | O'Keefe ............................ | 96/36.2 |
| 3,867,216 | 2/1975 | Jacob ................................ | 156/2 |
| 3,920,483 | 11/1975 | Johnson, Jr. et al. ............. | 148/1.5 |
| 4,004,044 | 1/1977 | Franco et al. .................... | 427/43 |
| 4,024,293 | 5/1977 | Hatzakis ........................... | 427/43 |
| 4,103,064 | 7/1978 | McAlear ........................... | 428/333 |

FOREIGN PATENT DOCUMENTS 2703738  3/1978  Fed. Rep. of Germany ........... 156/643
51-97038  1/1976  Japan .................................... 156/643

OTHER PUBLICATIONS

Alcorn et al., "Lift-Off Technique . . . ", IBM-TDB, 20 (1978), 4009.
Kleinfelder et al., "Ion-Bombardment . . . Polymers", IBM-TDB, 14 (1972), 2899.
Johnson et al., "Single Coat Photoresist . . . ", IBM-TDB, 19, (1976), 859.
Report, "An Introduction to Photofabrication . . . ", Kodak Publ. No. P-79, 1967, p. 26.
Dearnaly et al., (editors), Ion–Implantation, North-Holland, London, 1973, p. 507.
Beyer et al., "Forming Organic Si–Layer . . . ", IBM-TDB, 17, (1974), 1600.

Primary Examiner—L. Dewayne Rutledge
Assistant Examiner—Upendra Roy
Attorney, Agent, or Firm—Cushman, Darby & Cushman

[57] ABSTRACT

Method for the production of an LSI circuit device, in which method an organic compound film such as photoresist films is suitably treated to become a heat resistant film and it is used in various production processes as a mask pattern at a temperature of more than 200° C. without deforming the original size of the mask pattern.

34 Claims, 47 Drawing Figures

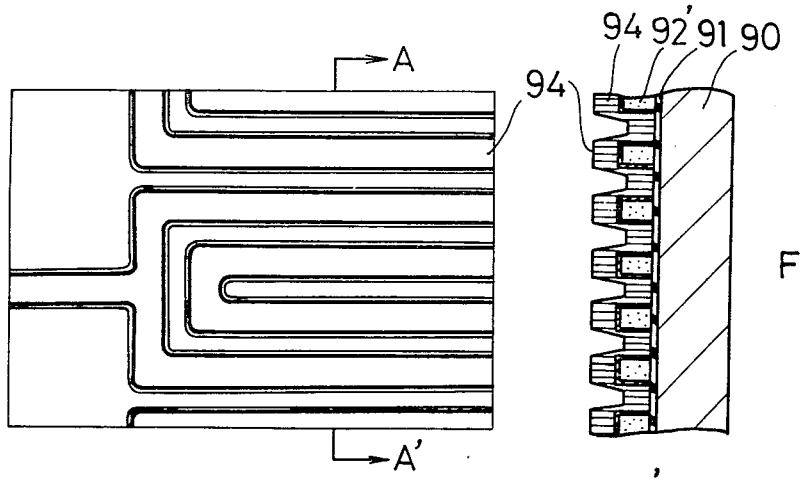
FIG.11 (a) FIG.11 (a')
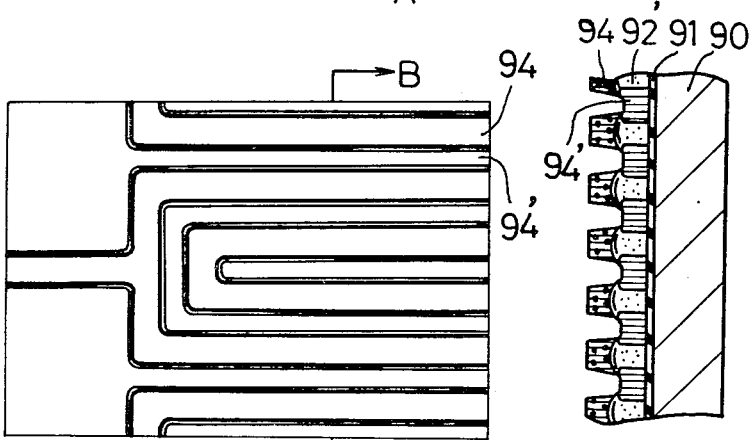
FIG.11 (b) FIG.11 (b')
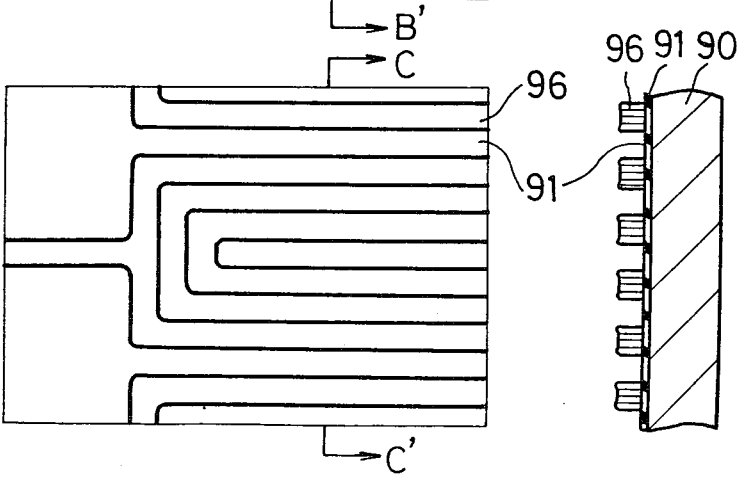
FIG.11 (c) FIG.11 (c')

PRETREATMENT OF PHOTORESIST MASKING LAYERS RESULTING IN HIGHER TEMPERATURE DEVICE PROCESSING

BACKGROUND OF THE INVENTION

1. Field of the Invention

This invention relates to a method of making a semiconductor device, more particularly to a fine process necessary for the production of a semiconductor LSI (large scale integrated) circuit.

2. Prior Art

In the conventional method of making a semiconductor device, a photo-sensitive resin film (photoresist film) is employed for a production of an IC (integrated circuit). However, the photoresist film is inherently not heat resistive, and therefore its use is limited to processes, during which it is not heated above 200° C. When the photoresist film is used to obtain a fine photoresist film pattern and if it is heated above 200° C. in a subsequent production process, then the photoresist film per se is softened and the fine photoresist film pattern changes the original shape thereof. This leads to undesirable outcomings in that the width of the fine photoresist film pattern spreads and top edges of the fine photoresist film pattern shape round. Moreover, the thickness of the film pattern decreases after it is heated at a high temperature.

It is substantially necessary in the conventional IC production process that the photoresist film is removed before it is subjected to a heating process.

SUMMARY OF THE INVENTION

The present invention purports to provide novel and simplified methods for production of an LSI circuit, in which method an organic compound film is suitably treated to become a heat resistant film and it can be used in several production processes at a temperature more than 200° C.

BRIEF DESCRIPTION OF THE DRAWINGS

FIG. 11(a), FIG. 11(b) and FIG. 11(c) schematically show magnified top plan patterns of the wafer of FIG. 10(c), FIG. 10(d) and FIG. 10(e), respectively.

FIG. 11(a'), FIG. 11(b') and FIG. 11(c') are cross sectional views along the lines A—A', B-B' and C—C' of FIG. 11(a), FIG. 11(b) and FIG. 11(c), respectively.

DETAILED DESCRIPTION OF THE INVENTION

A method of making a semiconductor device in accordance with the present invention comprises a first step of forming a photoresist an organic compound film pattern with a specified shape on a principal face of a semiconductor substrate, a second step of hardening the organic compound film pattern by changing at least the surface thereof to be heat durable and a third step of utilizing the organic compound film pattern as a means of a lift-off, an etching barrier or a diffusion mask.

In the conventional method of a manufacturing a semiconductor device by use of the photoresist film, it is necessary that the photoresist film is removed before it is subjected to a heating process, e.g. above 200° C., since the photoresist film changes the pattern shape if retained there.

The present inventor empirically found that heat resistivity of an organic compound film such as photoresist film can be increased by the use of one of the suitable hardening treatments listed below:

(i) heat treatment on the photoresist film in an inert gas at 170°-200° C., (ii) gas plasma irradiation on the photoresist film (preferably the gas is selected from an inert gas such as He, ne, Ar, Kr, Xe and $N_2$, a gas such as $CF_2Cl_2$, $CCl_3F$, $CClF_3$, $CHCl_2F$ and $CF_4$, and a gas such as $CCl_4$ and $C_2Cl_6$), (iii) ion implantation of an inert gas on the photoresist film (preferable gases are He, Ne, Ar, Kr and Xe).

After the photoresist film coating on a semiconductor substrate is suitably treated in the manner that it becomes heat resistant, a deposition film is formed over the entire substrate surface and then the pattern of the photoresist film is used as material of lift-off, an etching stopper barrier or a diffusion mask to obtain finely worked minute patterns of the deposite coating film or diffusion layers. Once the photoresist film is changed in physical properties, i.e., it becomes heat resistant, then it becomes heat resistant against the relatively high temperature that is necessary for forming a chemical vapor deposition (CVD) film, such as a silicon dioxide film, without changing the original shape of the photoresist film. This means that the CVD film is deposited on the photoresist film having the original pattern shape. It is found that the CVD film deposited on the photoresist film is rough having many pinholes. The present inventor further found that almost no change of the photoresist film pattern is observed although carbonization (hardening and blackening) proceeds, when the already hardened photoresist film is further heat-treated at a relatively high temperature (max. 1,100° C.).

Figure 1:
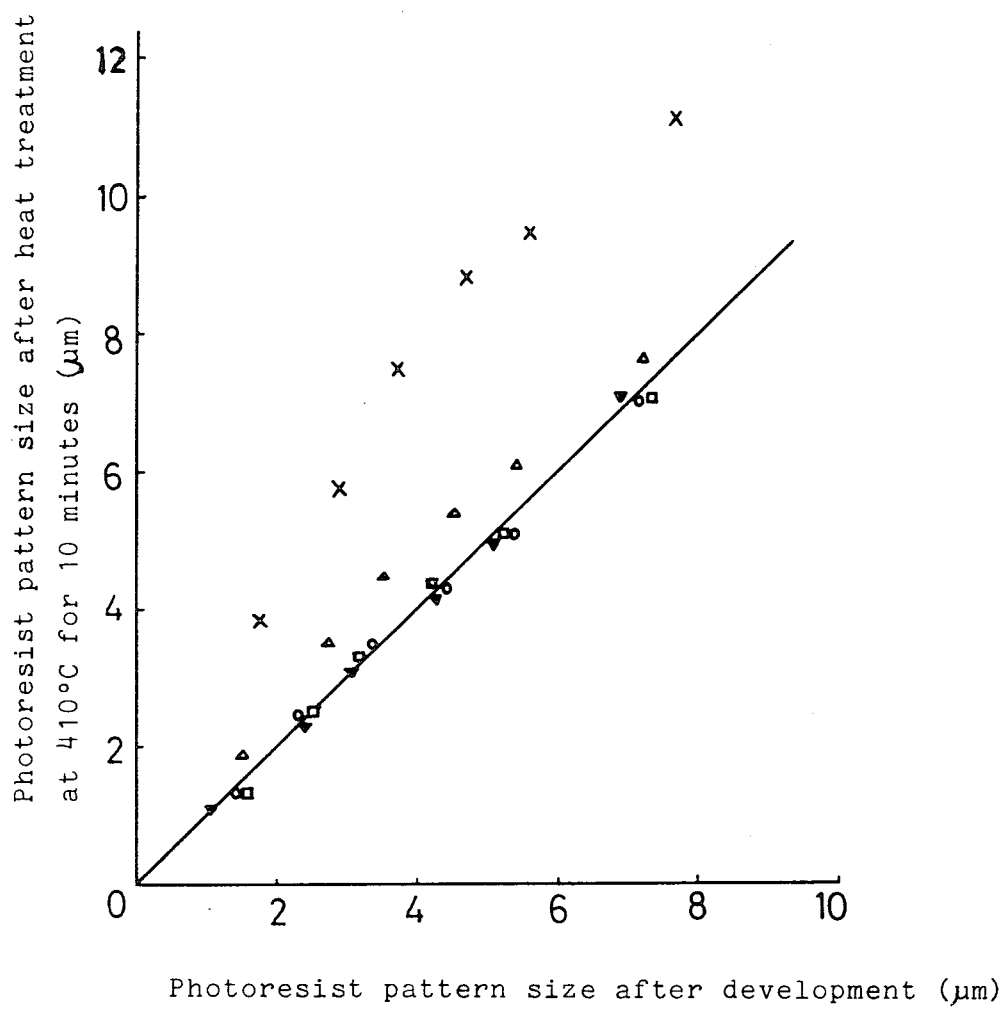
FIG. 1 is a graph showing width changes of photoresist films after several treatments thereon.

FIG. 1 is a graph for illustrating size of the width or length changes of a photoresist film pattern when the photoresist film is changed in quality and then heat treatment is made on it at a relatively high temperature (at 410° C. for 10 minutes). Hardening of the photoresist film is carried out in several ways: In the graph, marks O indicate sizes of photoresist film treated by CF₄ gas plasma irradiation (0.4 Torr gas pressure and output power of 20 W) for 10 minutes. Other treatment conditions are tabled below.

| mark | item treatment conditions |
|---|---|
| O | CF₄ gas plasma irradiation (0.4 Torr, 20W) for 10 minutes |
| Δ | N₂ gas plasma irradiation (1.0 Torr, 300W) for 10 minutes |
| □ | heat treatment in N₂ at 175° C. for 20 minutes |
| ▼ | Ar⁺ ion implantation at 150 KeV by 10¹⁵ (ions/cm²) |
| X | conventional postbaking at 150° C. for 25 minutes |

The abscissa of FIG. 1 indicates the pattern sizes of the photoresist film after developing. The oridinate indicates the pattern sizes of the photoresist film when the photoresist film is physically changed in the ways indicated in the table above and then heat treatment is made on it at 410° C. for 10 minutes. A straight line from the origin is drawn to show deviation of size change of the photoresist film pattern. The size changes of the photoresist films marked with O, Δ, □ and ▼ are small. On the other hand, the photoresist film, which is conventionally postbaked at 150° C. for 25 minutes, largely changes in pattern size. A similar size measurement was also attempt on a photoresist film, on which no hardening treatment is made before the high temperature heat treatment. However, the photoresist film sputters and the pattern size drastically gets out of shape during the high temperature heat treatment, and therefore no measurement results were available. The hardening of the photoresist film embodying the present invention enables a formation of a photoresist film pattern free from the pattern size change during a high temperature heat treatment.

The present invention provides novel and simplified methods of manufacturing LSI circuits, in which methods even a minute pattern structure is well reproduced. Preferred embodiments of the present invention are elucidated in the following by referring to the accompanying drawings and examples. The organic compound film is hereinafter referred to the photoresist film throughout.

EXAMPLE 1

Figure 2:
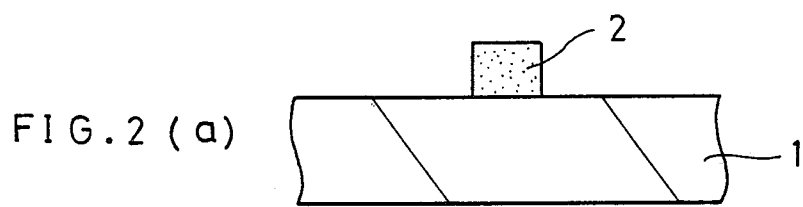
FIG. 2(a)-FIG. 2(e) are sectional views showing a process for making a $SiO_2$ film pattern embodying the present invention.
Figure 2:
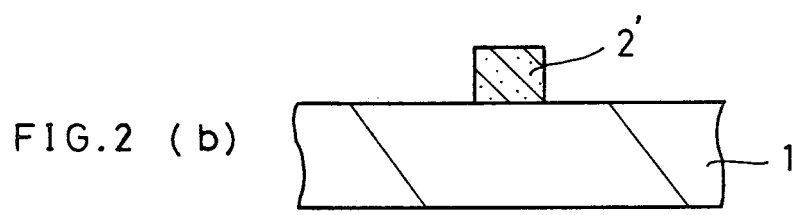
Figure 2:
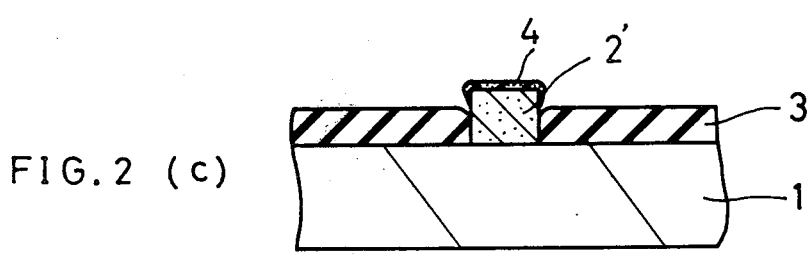
Figure 2:
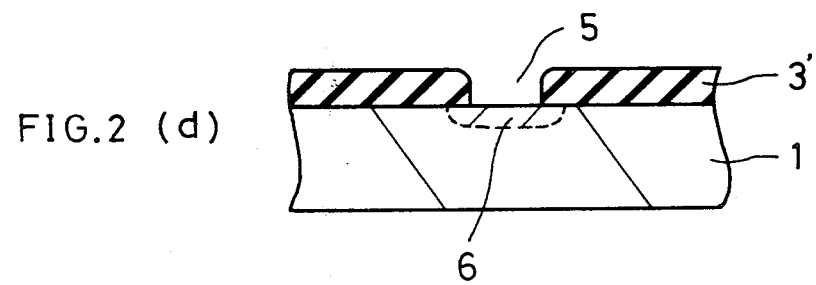
Figure 2:
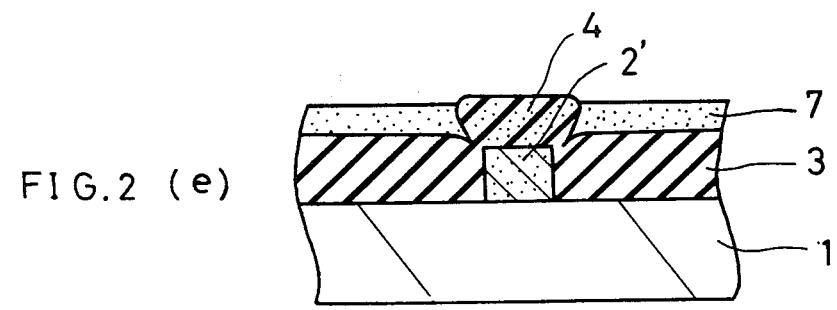

FIG. 2 shows one example of the method of manufacture in accordance with the present invention. In this example a silicon dioxide film pattern is formed by use of a photoresist film. A specified pattern 2 of a photoresist film is formed on a semiconductor substrate 1 by photolithography (FIG. 2(a)). A positive photoresist of Shipley Co., Ltd. (trade name AZ-1350J) is employed and the film thickness is set to be 1.5-2.0 μm in this example. Then, the photoresist film pattern 2 is heat-treated in an inert gas at about 180° C. for about 30 minutes to result in a hardened photoresist film pattern 2'. When the hardening heat treatment is made for a short time (about 5 minutes), then only the surface portion of the photoresist film pattern changes in physical quality and hardens. On the contrary, when the hardening heat treatment is made for a long time (about 30 minutes), then the whole photoresist film pattern changes in physical quality and hardens. The whole photoresist film pattern is preferably changed in its physical quality and hardened in the examples embodying the present invention.

A silicon dioxide film 3 is deposited by the CVD method by about 0.8 μm all over the substrate 1 (FIG. 2(c)). During this deposition process almost no change is observed in the photoresist film pattern 2' and a thin SiO₂ film 4 is formed on the top face and the side face of the photoresist film pattern 2'. The thickness of the SiO₂ film 4 is thinner than that of the SiO₂ film 3 for the following reason. The SiO₂ film deposition by the CVD method is carried out by the reaction by thermally decomposed silane and oxygen. This reaction is expressed by equation: $SiH_4 + O_2 \rightarrow SiO_2 + 2H_2 \uparrow$.

It is assumed that the supplied oxygen around the photoresist film pattern 2' is absorbed therein and that the carbonization thereof preceeds. Accordingly, SiO₂ is hardly deposited on and around the photoresist film pattern 2' leading to the film thickness difference. In addition to the thickness difference, the surface of the photoresist film pattern 2' is rough due to the carbonization that occurs during heating and accordingly the SiO₂ film 4 has many pinholes.

The SiO₂ film deposition by the CVD method in Example 1 is carried out under the following conditions:

| | |
|---|---|
| substrate temperature | 300–450° C., |
| SiH₄ flow rate | 400–900 cc/min., |
| O₂ flow rate | 200–900 cc/min., |
| flow rate of a carrier gas (e.g. N₂) | 40–70 l/min., |
| deposition rate | 300–4,000 Å/min. |

The photoresist film pattern 2 is hardened by the heat treatment in Example 1. It is also possible that the hardening of the photoresist film pattern may be made by a gas plasma irradiation or an ion implantation.

In the subsequent etching process, the photoresist film pattern 2' is removed together with the SiO₂ film 4 by supplying hot sulfuric acid through the pinholes in the SiO₂ film 4, by O₂ plasma etching, or by mechanical means. A pattern 3' of SiO₂ film is accordingly obtained (FIG. 2(d)). The SiO₂ film 4 is rough at a considerable rate and therefore the photoresist film pattern 2' is accurately and easily removed. It is confirmed that the SiO₂ film pattern 3' is also accurately formed when the SiO₂ film 3 is relatively thick (several μm).

When the SiO₂ film 3 is too thick to remove the photoresist film pattern 2', a modified process can be employed. After the SiO₂ film 3 is deposited, (i) a photoresist film pattern 7 having the opposite pattern to that of the photoresist pattern 2' is formed on the SiO₂ film 3 by photolithorgaphy, or (ii) a thick photoresist film is formed all over the coated surface of the substrate 1, then heat treatment is made on the thick photoresist film at a low temperature to smooth the surface thereof, and the photoresist film is removed by O₂ plasma etching to expose the surface of the SiO₂ film 4 in such a manner that the etching surface is in parallel to the surface of the SiO₂ film 3 during this O₂ plasma etching process. The resulting photoresist film pattern 7 by the process (i) or (ii) is shown by FIG. 2(e).

After the SiO₂ film 4 is etched away by an etchant containing HF, the photoresist film pattern 2' and the photoresist film pattern 7 on the SiO₂ film 3 are removed by O₂ plasma etching or hot sulfuric acid to obtain the SiO₂ film pattern 3' shown by FIG. 2(d).

According to the modified process, it is also possible to form the SiO$_2$ film pattern 3' precisely by use of the hardened photoresist film pattern 2' when the thickness of the SiO$_2$ film 3 is too large.

An opening 5 in the SiO$_2$ film pattern 3' is used for a metal contact or for an impurity diffusion process to form a diffusion region 6 (FIG. 2(d)). According to the manufacturing process in Example 1, the SiO$_2$ film pattern is obtained by use of the hardened photoresist film thereby simplifying the steps of the process. A high quality SiO$_2$ film is selectively deposited and therefore lift-off can easily be made. Moreover, fine working is correctly obtained even for a thick SiO$_2$ film.

EXAMPLE 2

Figure 3:
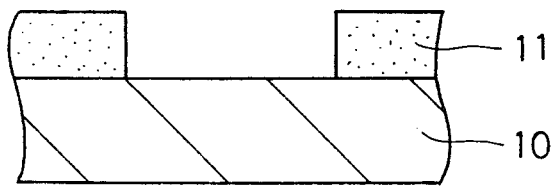
FIG. 3(a)-FIG. 3(c) are sectional views showing a process for making a diffusion layer embodying the present invention.
Figure 3:
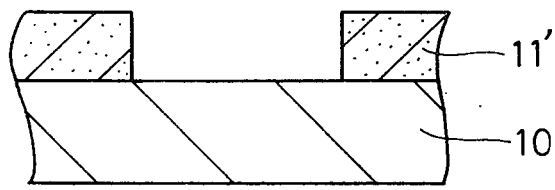
Figure 3:
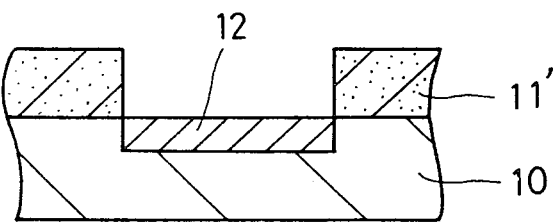

FIG. 3 shows another example of the method in accordance with the present invention. In this example a diffusion layer is selectively formed in a semiconductor substrate by a thermal diffusion process by using a photoresist film pattern as a diffusion mask.

A specified pattern 11 of a photoresist film is formed on a semiconductor substrate 10 by photolithography (FIG. 3(a)). The photoresist film pattern 11 is hardened in an inert gas at 180° C. for about 30 minutes, or by a plasma gas irradiation or by an ion implantation to obtain a hardened photoresist film pattern 11' (FIG. 3(b)). Then, a diffusion layer 12 is formed by a thermal diffusion process (FIG. 3(c)). The hardened photoresist film pattern 11' can be used later as an insulation film. It is also possible to remove it, for example by an O$_2$ plasma gas. In this example the diffusion layer can be formed selectively by the thermal diffusion method using the photoresist film pattern as a diffusion mask thereby simplifying the diffusion process. The diffusion process of Example 2 needs no etching process since the photoresist film pattern serves as the diffusion mask, and therefore accurate formation of the diffusion layer having a specified width is obtained.

EXAMPLE 3

Figure 4:
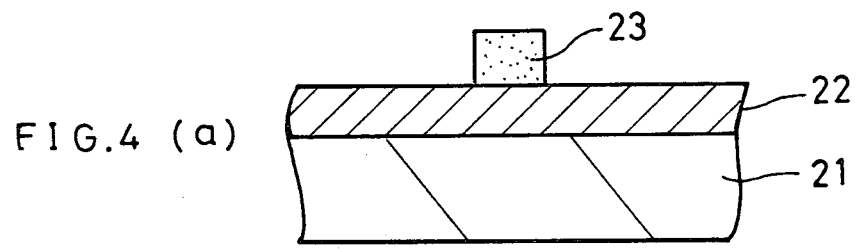
FIG. 4(a)-FIG. 4(d) are sectional views showing a process for making a $SiO_2$ film pattern embodying the present invention.
Figure 4:
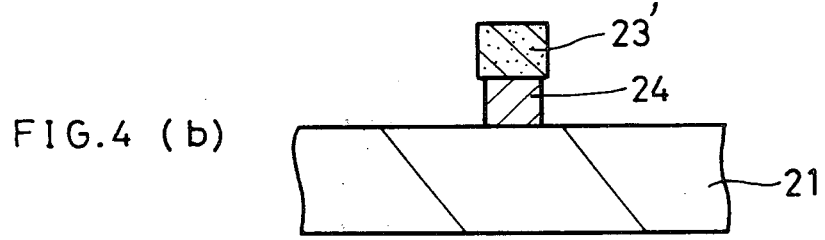
Figure 4:
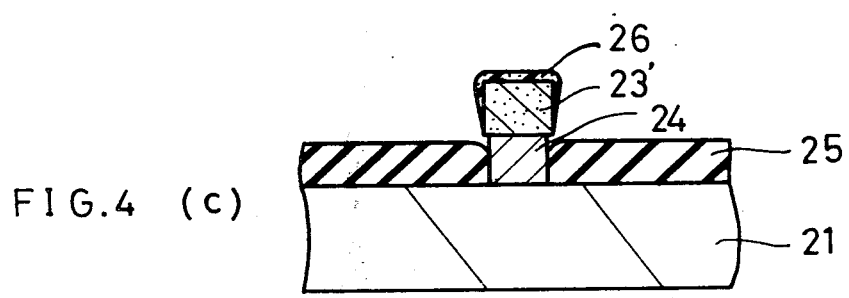
Figure 4:
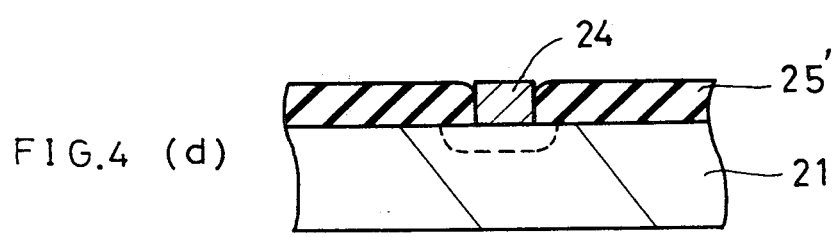

FIG. 4 shows another example of the method in accordance with the present invention. In this example a silicon dioxide film pattern is formed on a semiconductor substrate by use of a pattern consisting of a photoresist film and an Al film.

After an Al film 22 of about 8,000 Å is evaporated all over a semiconductor substrate 21, a specified pattern 23 of a photoresist film (e.g. about 3 μm wide) is formed by photolithography (FIG. 4(a)). Then, the photoresist film pattern 23 is changed in physical quality and hardened by exposing it in a plasma gas of CF$_4$Cl$_2$ (0.2–1.0 Torr, 10–100 W) for 1–10 minutes. A resulting hardened photoresist film pattern 23' becomes thoroughly heat resistant and adherence to the Al film 22 is also improved. The plasma gas irradiation gives satisfactory results giving rise to almost no change in the photoresist film pattern 23.

Unnecessary portions of the Al film 22 are etched away by an etchant containing phosphoric acid, where the hardened photoresist film pattern 23' serves as an etching mask to obtain an etched Al pattern 24 (FIG. 4(b)). In this etching process the Al film under the photoresist film pattern 23' is side-etched so that the width of the etched Al pattern amounts to about 2 μm. A SiO$_2$ film 25 of about 7,000 Å is deposited by the CVD method at a temperature between 300°–450° C. The SiO$_2$ film 25 covers all over the semiconductor substrate 21 with the Al pattern 24 and the photoresist film pattern 23' thereon (FIG. 4(c)). During this deposition process the hardened photoresist film pattern 23' is further carbonized and a thin SiO$_2$ film 26 is formed on the top face and the side face of the photoresist film pattern 23' like the case of Example 1. The thin SiO$_2$ film 26 is rough and has many pinholes.

The photoresist film pattern 23' is then removed together with the thin SiO$_2$ film 26 by fuming nitric acid or O$_2$ plasma gas, or by mechanical means. A resulting SiO$_2$ film pattern 25' is almost flush with the Al pattern 24 (FIG. 4(d)). It is possible to improve the surface quality of the Al pattern 23 by etching the surface thereof by several hundred Å by use of an etchant containing phosphoric acid, after the photoresist film pattern 23' is removed. It is also possible to harden the photoresist film pattern 23 after forming the etched Al pattern 24 by utilizing the photoresist film pattern 23 as the etching mask. Moreover, it is also possible to form another film, for example polycrystalline silicon film, in place of the Al pattern 24 in the SiO$_2$ film pattern 25'. This buried Al pattern 24 is used for a multi-layered wiring pattern or an ohmic contact electrode.

According to Example 3, a buried layer is obtained in the SiO$_2$ film pattern 25'. It is flush with the SiO$_2$ film pattern 25'. The formation of such a buried layer is quite useful in the production of a semiconductor integrated circuit. The application of the method in Example 3 will be described in the following.

EXAMPLE 4

Figure 5:
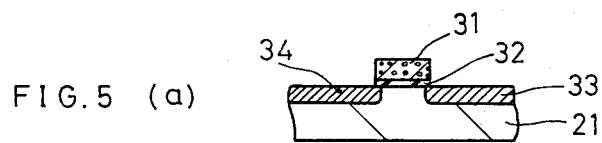
FIG. 5(a)-FIG. 5(f) are sectional views showing a process for making a MOS transistor using the making process of FIG. 4(a)-FIG. 4(d).
Figure 5:
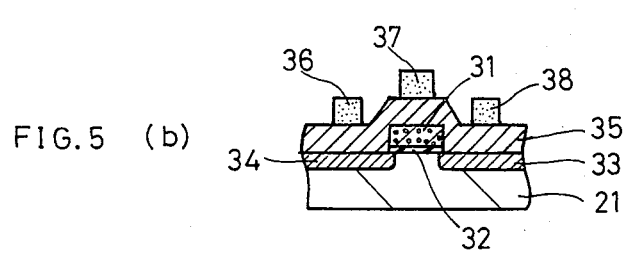
Figure 5:
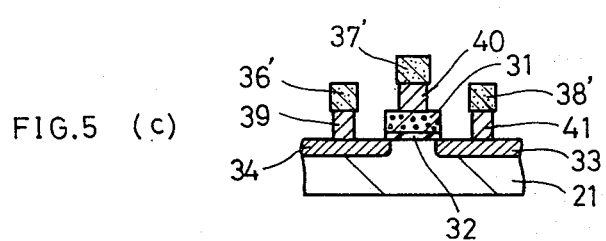
Figure 5:
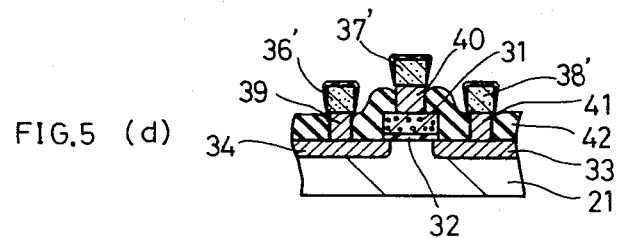
Figure 5:
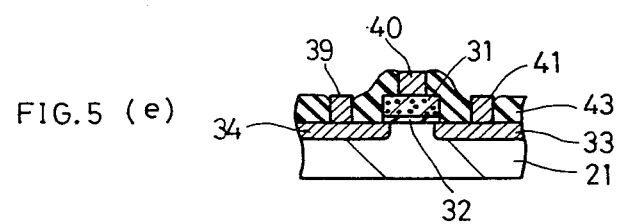
Figure 5:
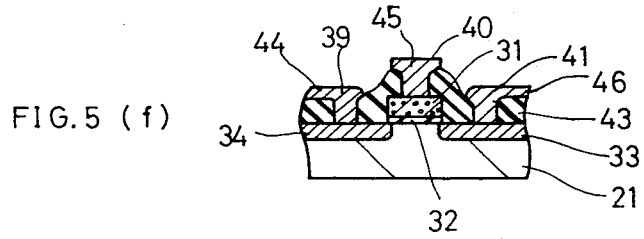

FIG. 5 shows a process of making an a MOS transistor using the process of FIG. 4(a)–FIG. 4(d). A source region 33 and a drain region 34 are formed in a semiconductor substrate 21 by a self-alignment diffusion method carried out simultaneously with a diffusion for a polycrystal silicon film 31 used for a gate electrode on a SiO$_2$ gate insulation film 32 (FIG. 5(a)). An Al film 35 of about 8,000 Å is evaporated all over the semiconductor substrate 21 and photoresist film patterns 36, 37 and 38 are formed by a mask for contact openings (FIG. 5(b)). Then, the photoresist film patterns 36, 37 and 38 are exposed in a CF$_4$Cl$_2$ plasma gas (0.2–1.0 Torr and electric output of 10–100 W) for 1–10 minutes to obtain hardened photoresist film patterns 36', 37' and 38'. Unnecessary portions of the Al film 35 are etched away by an etchant containing phosphoric acid by using the photoresist film patterns 36' 37' and 38' as an etching mask thereby forming Al film patterns 39, 40 and 41 (FIG. 5(c)). A SiO$_2$ film 42 of about 7,000 Å is deposited all over the semiconductor substrate 21 by the CVD method at a temperature between 300°–450° C. (FIG. 5(d)).

The photoresist film patterns 36', 37' and 38' are then removed together with the thin SiO$_2$ film thereon by fuming nitric acid or O$_2$ plasma gas, or by a mechanical means. The surface of the Al film patterns 39, 40 and 41 is etched away by about several hundred Å by use of an etchant containing phosphoric acid. The resulting surfaces of the Al film patterns 39, 40 and 41 are respectively almost flush with a SiO$_2$ film pattern 43 (FIG. 5(e)). Additional Al film patterns 44, 45 and 46 are formed on the existing Al film patterns 39, 40 and 41 to obtain electrode patterns. The electrode patterns of the Al film patterns are well defined and have no steps at the boundaries between the SiO$_2$ film pattern 43 and the Al film patterns 39, 40 and 41. This is quite advantageous since they are free from disconnection problems.

According to the method of Example 4, one does not need to form a contact window in the SiO₂ film, since the SiO₂ film pattern 43 for isolation of the Al patterns 39, 40 and 41 in contact with the source, drain and gate regions is substantially formed when the SiO₂ film 42 is deposited. This means that no mask registration process is necessary. The process of Example 4 is free from the conventional problem of short-circuiting of the gate electrode of the polycrystal Si film 31 with the diffusion regions arising from shifting of the contact holes due to inaccuracy of the mask registration and from widening of the contact holes due to side-etching. Moreover, since the SiO₂ film 42 is deposited by the CVD method after the Al film patterns 39, 40 and 41 are formed, the Al film patterns 39, 40 and 41 are sintered at a high temperature during the CVD process. No conventional sintering process is necessary. In the conventional sintering process for a conductive film (the Al film 35 in Example 4), Al tends to get into the substrate and to pass through the diffusion regions since much Al covers the substrate surface including contact openings.

On the contrary, Al hardly gets into the substrate 21 in Example 4 when the Al film patterns 39, 40 and 41 are sintered during the CVD process, since the Al film patterns 39, 40 and 41 partly cover the substrate surface at the contact openings. Such sintering process is especially advantageous for the production of an LSI circuit of a high density. In Example 4, it is also possible to form the polycrystal silicon film 31 used for the gate electrode following the method described in Example 3.

EXAMPLE 5

Figure 6:
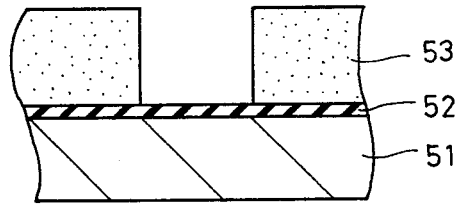
FIG. 6(a)-FIG. 6(d) are sectional views showing a process for making a polycrystal Si film pattern embodying the present invention.
Figure 6:
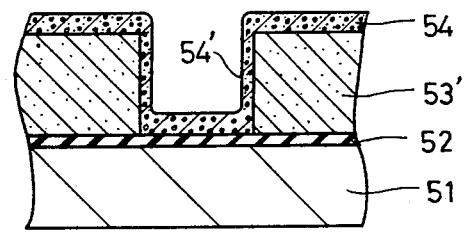
Figure 6:
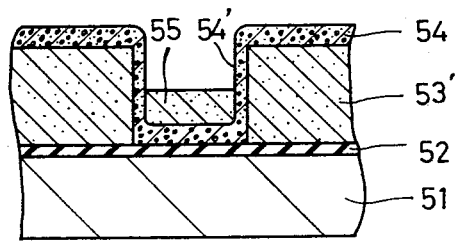
Figure 6:
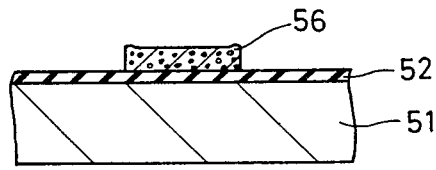

FIG. 6 shows another example of the method in accordance with the present invention. In this example a polycrystal silicon film pattern is formed on a semiconductor substrate by use of a photoresist film. A SiO₂ film 52 is thermally grown on a semiconductor substrate 51 and a specified photoresist film pattern 53 is formed thereon by photolithography (FIG. 6(a)). A positive photoresist of Shipley Co., Ltd. (trade name AZ-1350J) is employed for the photoresist film pattern 53 of 1.5–2.0 μm thickness. The photoresist film pattern 53 is then hardened by an Ar⁺ ion implantation at 150 KeV with a current density of 1.5 μA/cm² at a dose level of 2×10¹⁵ ions/cm². A resulting hardened photoresist film pattern 53' is then coated by a polycrystal silicon film 54 of about 0.5 μm by a CVD method. A thin polycrystal silicon film 54' is deposited on the side faces of the photoresist film pattern 53' (FIG. 6(b)). The surface of the photoresist film pattern 53' is rough, and therefore the polycrystal silicon films 54 and 54' have many pinholes.

The abovementioned polycrystal Si film deposition is carried out under the following conditions:

| | |
|---|---|
| semiconductor substrate temperature | 600–700° C.*, |
| SiH₄ flow rate | 0.5–2.0 l/min., |
| flow rate of a carrier gas (e.g. N₂) | 25–40 l/min., |
| deposition rate | 200–600 Å/min. |

*Note:
The semiconductor substrate is gradually heated up in the carrier gas (N₂) up to 600–700° C. within 15–20 minutes.

Almost no change of the photoresist film pattern 53' is observed after the CVD process. A photoresist film pattern 55 is then formed at a concave portion of the photoresist film pattern 53 (FIG. 6(c)). It can be formed by the following two different ways: (i) the formation of the photoresist film pattern 55 by a photolithography technique; (ii) a process step of forming a thick photoresist film all over the surface by the polycrystal Si films 54 and 54', of carrying out a heat treatment thereon at a low temperature (below 180° C.) to make the thickness of the photoresist film on the polycrystal Si film 54 thicker than that of the photoresist film on the polycrystal Si film in the concave portion (the melted photoresist falls down to the concave portion of the photoresist film pattern 53), and removing the photoresist film on the polycrystal Si film 54 by an O₂ gas plasma etching to obtain the photoresist film pattern 55.

Then, the polycrystal Si films 54 and 54' are etched away by an etchant containing of hydrofluoric acid and nitric acid or a CF₄ plasma gas, and both photoresist film patterns 53' and 55 are etched away by hot sulfuric acid or an O₂ plasma gas to obtain a polycrystal Si film pattern 56. The process in Example 5 is also applicable to other film pattern such as a silicon nitride film patterns, which can be deposited at a temperature of around 700° C. without deteriorating a hardened photoresist film pattern.

In the process of Example 5 the polycrystal Si film 54 is removed by the etching process. In case the photoresist film pattern 53' is more than 5–7 times as thick as the polycrystal Si film 54, it is also possible to lift off the polycrystal Si film 54 by removal of the photoresist film pattern 53'. This is because the more the thickness of the polycrystal Si film 54 and the photoresist film pattern 53' differs, the thinner and the more rough the polycrystal Si film 54' deposited on the side faces of the photoresist film pattern becomes. Therefore, lift-off of the photoresist film pattern 53' is possible by a stripping etchant or an O₂ plasma gas through pinholes in the polycrystal Si film 54'. According to the process of Example 5, a precise deposition film pattern can be formed free from the deformation of the photoresist film pattern due to high temperature. The deposition film pattern is precisely determined by the photoresist film pattern free from side-etching problems. Moreover, the process of Example 5 can be simplified when the lift-off technique is applicable to the deposition film pattern (polycrystal Si film 54) and the photoresist film pattern 53'. It is also possible to precisely form a fine pattern of a thick deposition film.

EXAMPLE 6

Figure 7:
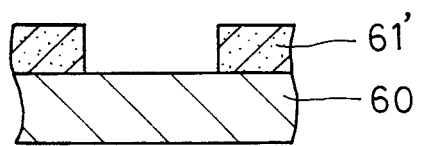
FIG. 7(a)-FIG. 7(d) are sectional views showing a process for making a diffusion layer embodying the present invention.
Figure 7:
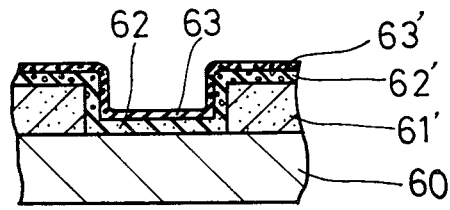
Figure 7:
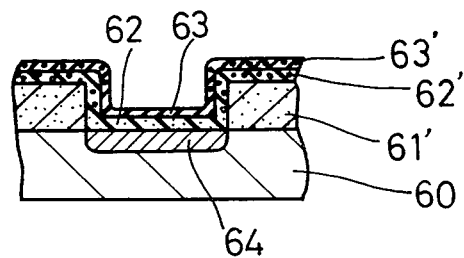
Figure 7:
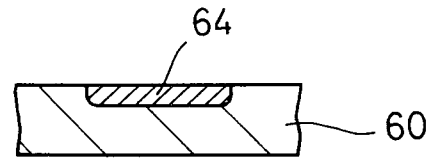

FIG. 7 shows another example of the method in accordance with the present invention. In this example a diffusion layer is selectively formed in a semiconductor substrate by using a photoresist film pattern as a diffusion mask. A specified pattern 61 of a photoresist film is formed on an n-type semiconductor substrate 60 by a photolithography technique (FIG. 7(a)). In this example the photoresist film pattern 61 is 1.5–2.0 μm thick. The semiconductor substrate 60 with the photoresist film pattern 61 is then heat-treated in an inert gas at 180° C. for about 30 minutes. Accordingly, the photoresist film pattern 61 is hardened resulting in a heat resistant photoresist film pattern 61'. A doped SiO₂ film 62 is deposited at about 0.1 μm thick on the heat resistant photoresist film pattern 61' by a CVD method, and then a thin SiO₂ film 63 is deposited thereon in order to prevent impurities coming out from the doped SiO₂ film 62 (FIG. 7(b)). The surface of the photoresist film pattern 61' is rough and has many pinholes due to the carbonization reaction that occurs during hardening, and therefore both of the deposited doped SiO₂ film 62' and the thin SiO₂ film 63' on the top faces and side faces of the photoresist film pattern 61' are porous having many pinholes.

The doped SiO₂ film deposition by the CVD method in Example 6 is carried out under the following conditions:

| | |
|---|---|
| semiconductor substrate temperature | 300–450° C., |
| SiH₄ flow rate | 400–900 cc/min., |
| O₂ flow rate | 200–900 cc/min., |
| doped gas (e.g. B₂H₆ of 1% in N₂) | 50–400 cc/min., |
| carrier gas (e.g. N₂) | 40–70 l/min., |
| deposition rate | 300–4,000 Å/min. |

The semiconductor substrate 60 is then heat-treated at a high temperature (1,000°–1,100° C.) to obtain a selectively formed diffusion layer 64 at the surface of the semiconductor substrate 60 (FIG. 7(c)). There is no possibility that impurities in the doped SiO₂ film 62' diffuse into the semiconductor substrate 60 under the photoresist film pattern 61' during the high temperature heat treatment, since the photoresist film pattern 61 of 1.5–2.0 μm thickness lies between the doped SiO₂ film 62' and the semiconductor substrate 60, and since the impurities in the doped SiO₂ film 62' diffuse out through the pinholes in the thin SiO₂ film 63'.

Then, the SiO₂ films 63 and 63' as well as the doped SiO₂ films 62 and 62' are etched away by an etchant containing hydrofluoric acid, and the photoresist film pattern 61' is removed by hot sulfuric acid, an O₂ plasma gas, or by suitable mechanical means. This results in the diffusion layer 64 in the semiconductor substrate 60.

According to the process in Example 6, it is possible to form a selective diffusion layer by a doped SiO₂ film using a photoresist film pattern as a diffusion mask. This process simplifies the conventional manufacturing process for a diffusion layer. Moreover, a diffusion layer having a specified diffusion width is precisely obtained by using a photoresist film pattern as a diffusion mask.

The process of Example 6 is applied to a process for making an npn back-gate bipolar transistor in the following example.

EXAMPLE 7

Figure 8:
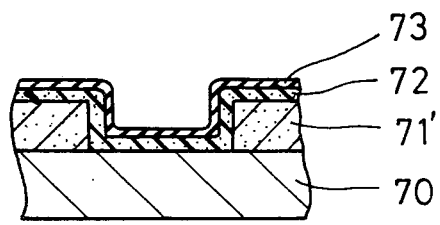
FIG. 8(a)-FIG. 8(d) are sectional views showing a process for making a bipolar transistor using the making process of FIG. 7(a)-FIG. 7(d).
Figure 8:
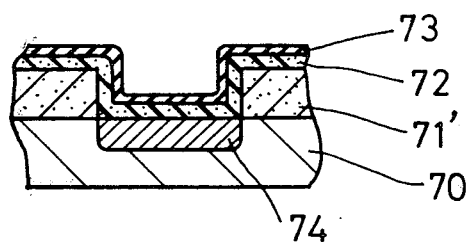
Figure 8:
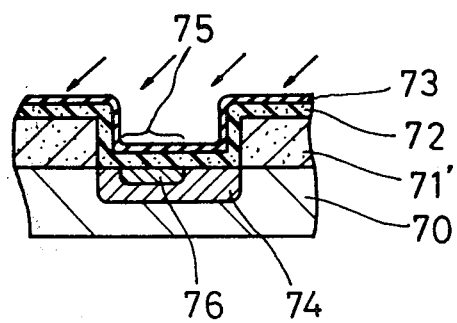
Figure 8:
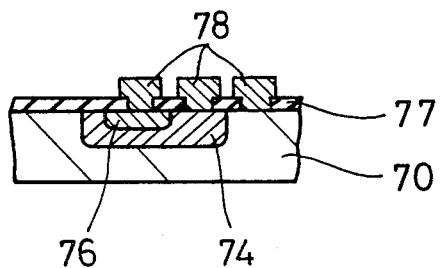

FIG. 8 shows the process of making an npn backgate bipolar transistor in accordance with the present invention. A specified pattern of a photoresist film is formed on an n-type semiconductor substrate 70 by a photolithography technique. In this example the photoresist film pattern is 1.5–2.0 μm thick. The semiconductor substrate 70 with the photoresist film pattern is then heat-treated in an inert gas at 180° C. for about 30 minutes. Accordingly, the photoresist film pattern is hardened resulting in a heat resistant photoresist film pattern 71'. A doped SiO₂ film 72 containing boron is deposited to a thickness of about 800 Å on the heat resistant photoresist film pattern 71' by a CVD method, and then a thin SiO₂ film 73 of 500 Å thickness is deposited thereon in order to prevent impurities coming out from the doped SiO₂ film 72 (FIG. 8(a)).

Then, a high temperature heat treatment is carried out on the semiconductor substrate 70 to obtain a selectively formed diffusion layer 74 of p-type at the surface of the semiconductor substrate 70 (FIG. 8(b)). Phosphorus ions are then ion-implanted into the semiconductor substrate 70 from a direction having an oblique angle with respect to the substrate surface. Accordingly, an n-type diffusion layer 76 is formed only under a specified portion 75 of the photoresist film pattern 71' (FIG. 8(c)). It is also possible to employ a standard ion implantation configuration, where ions are implanted from a direction perpendicular to the substrate surface. In such case, it is necessary to form a photoresist film pattern for a base contact opening by a photomask registration prior to the ion implantation process.

After the SiO₂ film 73, the doped SiO₂ film 72 and the photoresist film pattern 71' are removed, a SiO₂ film 77 is thermally grown and an Al film is evaporated after forming contact openings in the SiO₂ film 77 by a photoetching technique. Then, the evaporated Al film is photoetched to obtain contact electrodes 78. The resulting npn bipolar transistor comprises the n-type diffusion layer 76 as an emitter region, the p-type diffusion layer 74 as a base region, and the semiconductor substrate 70 as a collector region.

According to the process of Example 7, the diffusion layer 74 can be selectively formed without removing the photoresist film pattern thereby simplifying the conventional manufacturing process. Moreover, the self-alignment like formation of the diffusion layer 76 provides a reliable method of making IC devices.

EXAMPLE 8

Figure 9:
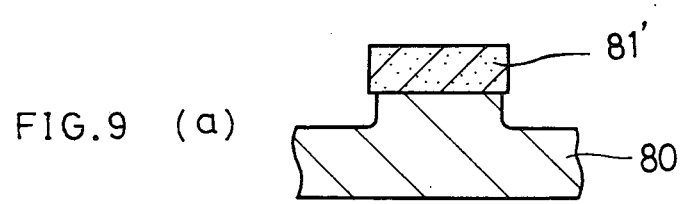
FIG. 9(a)-FIG. 9(d) are sectional views showing a process for making a diffusion layer embodying the present invention.
Figure 9:
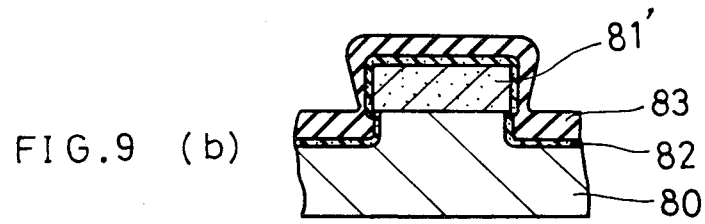
Figure 9:
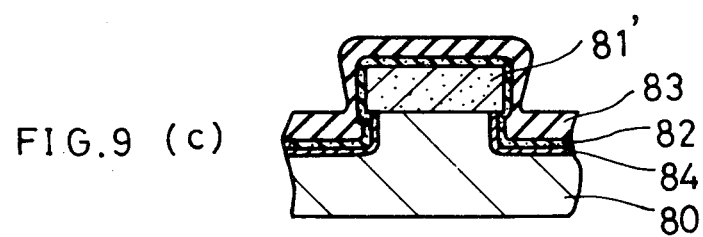
Figure 9:
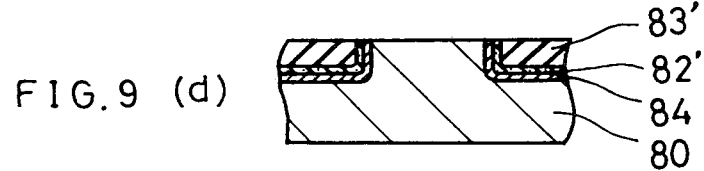

FIG. 9 shows an applied example of the process of the present invention for an IC device having a LOCOS (localized oxidation of silicon) configuration. The LOCOS configuration has several advantages: (i) The field inversion can be prevented and (ii) stray capacity can be reduced.

The following is a description for making an n-type semiconductor substrate. A specified pattern of a photoresist film is formed on an n-type semiconductor substrate 80. The photoresist film pattern is 1.5–2.0 μm thick. The semiconductor substrate 80 with the photoresist film pattern is then exposed to a CF₄ plasma gas to etch the substrate surface by about 0.7 μm other than the surface under the photoresist film pattern. During this etching process the photoresist film pattern is hardened to result in a heat resistant photoresist film pattern 81'. A doped SiO₂ film 82 containing boron is deposited to a thickness of about 0.1 μm on the heat resistant photoresist film pattern 81' by a CVD method, and then a SiO₂ film 83 of 0.6 μm thickness is deposited thereon (FIG. 9(b)). Then, a high temperature heat treatment is carried out on the semiconductor substrate 80 to obtain a selectively formed diffusion layer 84 of p-type material at the surface of the semiconductor substrate 80 in contact with the doped SiO₂ film 82 (FIG. 9(c)). Finally, the photoresist film pattern 81' as well as the doped SiO₂ film 82 and the SiO₂ film 83 are removed by fuming nitric acid, an O₂ plasma gas or mechanical means. A resulting semiconductor device has a SiO₂ film pattern 83' flush with the original surface of the semiconductor substrate 80 (FIG. 9(d)).

According to the process of Example 8, it is possible to obtain a semiconductor device having a structural configuration such that the doped SiO₂ film pattern 82' and the SiO₂ film pattern 83' are buried in the semiconductor substrate 80 flush with the surface of the semiconductor substrate 80. Such a structural configuration has a number of applications in the manufacture of an IC device. The SiO₂ films 82 and 83 are deposited by the CVD method at a low temperature in a short time in the process of Example 8, whereas in the conventional process it is necessary to grow a thermal oxidation film at a high temperature for a long time after an ion implantation process is carried out. Moreover, lift-off of the photoresist film pattern 81' is quite easy since the doped SiO₂ film 82 and the SiO₂ film 83 are thin and rough with many pinholes, whereas in the conventional process lift-off of e.g. a CVD SiO₂ film by use of an Al film requires more steps than in the case of the present invention.

In Example 8 the photoresist film pattern of a single layer is used as the diffusion mask for the doped SiO₂ film 82. It is also possible to use a mask of a multi-layered film consisting of a thin insulation film and a photoresist layer, when contamination of the substrate surface due to the photoresist film pattern plays an important role on the device characteristics. A manufacturing process using the mask of a multi-layered film is described in the following. A thin SiO₂ film of 0.08–0.2 μm is thermally grown on a semiconductor substrate and a photoresist film pattern is made thereon by a photolithography technique. Then, the thin SiO₂ film is etched away by an etchant consisting of hydrofluoric acid to obtain a multi-layered film pattern. The multi-layered film pattern consisting of the thin insulation film and the photoresist film pattern can be applied to the process of Examples 1, 2, 6 and 7 in place of the single-layered photoresist film pattern. In the final process of removing the multi-layered film pattern, the photoresist film pattern is removed followed by the removal of the thin SiO₂ film. The employment of the multi-layered film pattern provides a method of making IC devices free from contamination of the substrate surface due to the photoresist film pattern.

It is also possible to use a doped SiO₂ film containing other impurities such as phosphorous in place of the boron-doped SiO₂ film in the process of Examples 6 and 7. The high temperature heat treatment to obtain the diffusion layer 84 is carried out in Example 8 while the photoresist film pattern 81' is on the semiconductor substrate 80. Such high temperature heat treatment is also possible after the photoresist film pattern 81' is removed.

The process of Example 8 can provide simplified and accurate formation of a semiconductor device having a structural configuration such that a doped SiO₂ film pattern and a SiO₂ film are burried in a semiconductor substrate flush with the surface of the semiconductor substrate.

EXAMPLE 9

Figure 10:
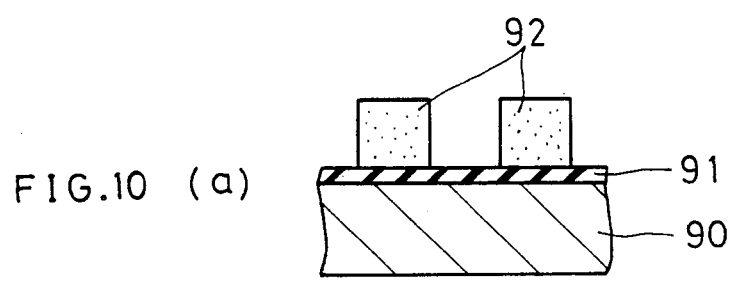
FIG. 10(a)-FIG. 10(e) are sectional views showing a process for making an Al film pattern embodying the present invention.
Figure 10:
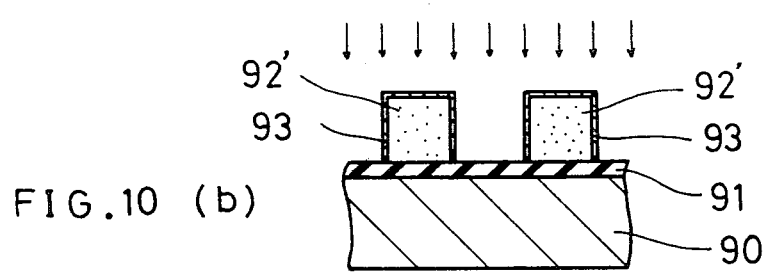
Figure 10:
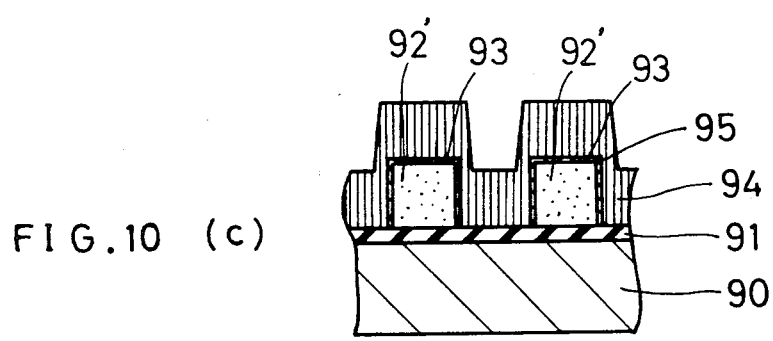
Figure 10:
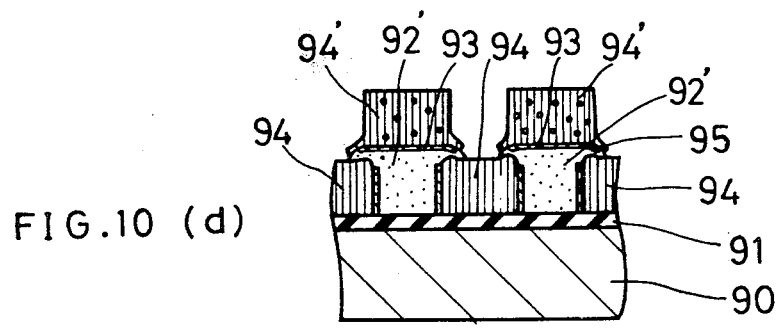
Figure 10:
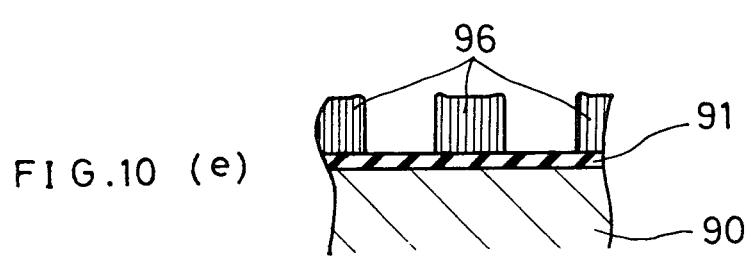

FIG. 10 shows another example of the method in accordance with the present invention. In this example an Al film pattern is formed on a semiconductor substrate by using a photoresist film pattern. A specified pattern 92 of a positive photoresist film is formed on a semiconductor substrate 90 with a thermally-grown SiO₂ film 91 by a photolithography technique (FIG. 10(a)). The photoresist film pattern is 1.5–2.0 μm thick. The semiconductor substrate 90 with the photoresist film pattern 92 is then exposed to a N₂ plasma gas (0.2–1.0 Torr, 150–300 W) or a CF₄ plasma gas (0.2–1.0 Torr, 20–100 W) for 1–5 minutes. Adherence of the photoresist film pattern 92 to the SiO₂ film 91 is improved and a surface layer 93 of the photoresist film pattern is hardened during the plasma gas irradiation (FIG. 10(b)). No deformation of the photoresist film pattern 92 is observed. Then, an Al film 94 of 1.0–1.2 μm thickness is evaporated all over the semiconductor substrate 90 by an electron beam evaporation apparatus (FIG. 10(c)). There is no deformation of the photoresist film pattern 92 due to heat-up of the semiconductor substrate 90 during the Al evaporation process. The evaporated Al film 94 around edges 95 of the photoresist film pattern 92 is thin and rough having many pinholes.

The semiconductor substrate 90 is subjected to a heat treatment, for example in a N₂ gas atmosphere at a temperature between 200°–400° C. (FIG. 10(d)). Such heat treatment is carried out for a few minutes at a temperature higher than that of heat-up of the semiconductor substrate 90 during the abovementioned heat treatment by the plasma gas irradiation and the Al evaporation process. Adherence of the Al film 94 to the SiO₂ film 91 is improved during the last heat treatment, and at the same time the emulsion in a photoresist film pattern 92' expands (producing many bubbles). Accordingly, the Al film 94 on the photoresist film pattern 92' turns to a bubble-containing Al film pattern 94', and the emulsion in the photoresist film pattern 92' comes out from the edges 95 by breaking thin portions of the Al film 94.

In a next step the photoresist film pattern 92' as well as the bubble-containing Al film pattern 94' is removed by use of an O₂ plasma gas or a photoresist stripping etchant to obtain an Al film pattern 96 (FIG. 10(e)).

FIG. 11(a), FIG. 11(b) and FIG. 11(c) schematically show magnified top plan patterns of the semiconductor substrate of FIG. 10(c), FIG. 10(d) and FIG. 10(e), respectively. FIG. 11(a'), FIG. 11(b') and FIG. 11(c') are cross sectional views along the lines A-A', B-B' and C-C' of FIG. 11(a), FIG. 11(b) and FIG. 11(c), respectively.

It is also possible to form precisely the Al film pattern 96 having a pattern width of e.g. 5 μm in the case of an Al film of 1.0–1.2 μm in thickness.

One example of the conventional manufacturing process of the Al film pattern is as follows:

(i) A photoresist film pattern is formed on an oxide film grown on a semiconductor substrate, (ii) an Al film is evaporated all over the semiconductor substrate, and (iii) the photoresist film pattern as well as the Al film thereon is removed, for example by giving ultrasonic vibrations to the semiconductor substrate in acetone resulting in an Al film pattern.

In the process (ii), it is necessary that the Al film is thin and rough at the side faces of the photoresist film pattern. An etchant penetrates the thin and rough Al film at the side faces in the lift-off process (iii).

The abovementioned conventional manufacturing method has shortcomings such that the photoresist film pattern softens due to the high temperature during the Al film evaporation. Therefore, the pattern size widens, the photoresist film pattern becomes round at the edges thereof and the Al film becomes thick at the side faces of the photoresist film pattern. Accordingly, it is not possible to obtain a precise Al film pattern when the evaporated Al film becomes thick. Moreover, the conventional manufacturing method is not applicable to a heat treatment process above 200° C. since the photoresist film is not heat resistant.

On the other hand, the process of Example 9 of the present invention provides the possibility that the photoresist film pattern can easily be removed by an O₂ plasma gas or a photoresist stripping etchant. This is because the Al film at the edges of the photoresist film is thin and has many pinholes and because the Al film is broken around the edges of the photoresist film. Other conductive films such as Mo can be lifted off by the use of a photoresist film in a similar manner as described above. It is also possible to employ other inert gases such as argon, xenon and helium as a plasma gas.

EXAMPLE 10

Figure 12:
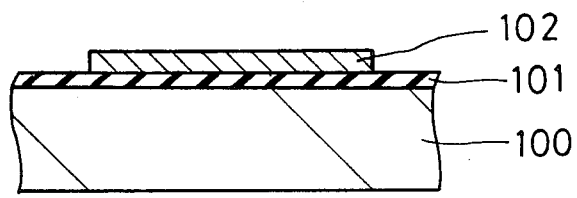
FIG. 12(a)-FIG. 12(d) are sectional views showing a process for making a $SiO_2$ film pattern using a photoresist film as an etching stopper after the photoresist film is treated by the method embodying the present invention.
Figure 12:
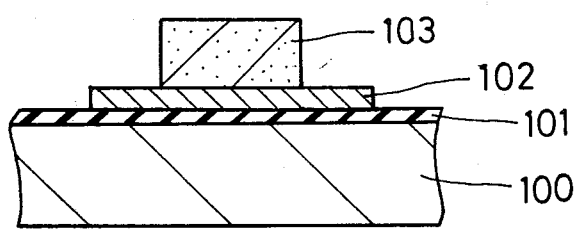
Figure 12:
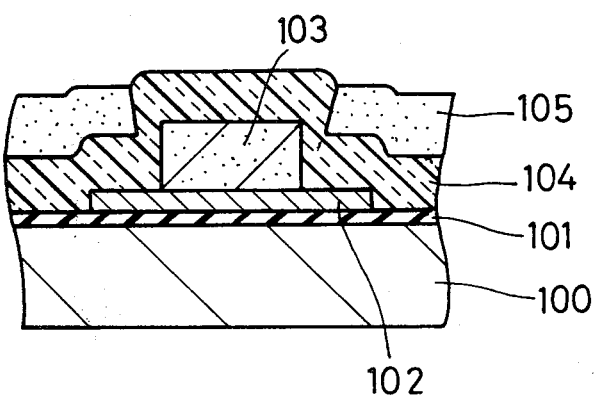
Figure 12:
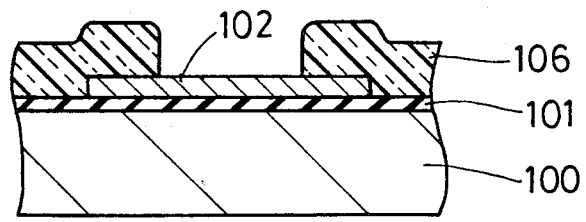

FIG. 12 shows still another example of the method in accordance with the present invention. In this example a silicon dioxide film pattern is formed by using a example a silicon film pattern is formed by using a photoresist film pattern as an etching barrier or stopper means. An Al film pattern 102 is formed by a photo-etching technique after an Al film of 0.2 μm thickness is evaporated on a silicon dioxide film 101 thermally grown on a semiconductor substrate 100 (FIG. 12 (a)). A specified pattern 103 of a photoresist film is formed by a photolithography technique, and then it is hardened by an $Ar^+$ ion implantation (FIG. 12 (b)). After a $SiO_2$ film 104 is deposited to about 0.7 μm in thickness by a CVD method, (i) a photoresist film pattern 105 having the opposite pattern to that of the photoresist film pattern 103 is formed on the $SiO_2$ film 104 by a photolithography technique, or (ii) a thick photoresist film is formed to coat all over the coated surface of the semiconductor substrate, then a heat treatment is given to the thick photoresist film at a low temperature to smooth the surface thereof, and the photoresist film is removed by $O_2$ plasma etching to expose the surface of the $SiO_2$ film 104 in such a manner that the etching surface is parallel to the surface of the $SiO_2$ film 101 during this $O_2$ plasma etching process. A resultant photoresist film pattern 105 by the process (i) or (ii) is shown by FIG. 12 (c).

After the $SiO_2$ film 104 on the photoresist film pattern 103 is etched away by an etchant such as HF, the photoresist film pattern 103 and the photoresist film pattern 105 on the $SiO_2$ film 104 are removed by $O_2$ plasma etching to result in a $SiO_2$ film pattern 106 (FIG. 12 (d)).

The conventional manufacturing method of such a $SiO_2$ film is as follows: After a $SiO_2$ film is deposited on an Al film, a $SiO_2$ film pattern is formed by etching the $SiO_2$ film using an etchant consisting of HF. But such making method has shortcomings in that the underlying Al film is also etched thereby decreasing the Al film thickness or etching away the Al film when the Al film is thin. On the other hand, the method of Example 10 provides the possibility to form the $SiO_2$ film pattern 106 without etching the Al film pattern 102, since the photoresist film pattern 103 serves as an etching stopper. The method of Example 10 is also applicable to a process of making a window for a bonding pad of IC devices.

It is also possible to form a $SiO_2$ film pattern in another structure, in which the underlying Al film is replaced by a layer, e.g. a doped $SiO_2$ film. Although both $SiO_2$ films are etched by the same etchant, the $SiO_2$ film pattern is obtained without etching the underlying doped $SiO_2$ film.

The method of the present invention is exemplified by Example 1–Example 10, where photoresist films by Shipley (under trade name:AZ 1350J) are employed as organic compound films. It is also possible to use other photoresist films containing a quinone diazo compound (for example, Shipley's AZ-1350, AZ-119 and AZ-2400; Hunt's Waycoat LSI Posi Resist; Kodak's Kodak Posi-809; Tokyo Ohka Kogyo's OFPR-2 and OFPR-77) or containing polyvinyl cinnamic acid (for example, Tokyo Ohka Kogyo's TPR and OSR; Kodak's KPR).

The present invention provides methods for the production of an LSI circuit device, in which methods organic compound films such as photoresist films are suitably treated resulting in heat resistant films and they are used in several production processes as a mask pattern at temperatures of more than 200° C. without deforming the original size of the mask pattern. Therefore, the process in accordance with the present invention is useful for production of LSI devices.

What is claimed is:
1. A method of making a semiconductor device comprising the steps of:
    (1) forming a photoresist film pattern having a predetermined shape on a principal face of a semiconductor substrate,
    (2) hardening said photoresist film pattern by changing the physical property of at least the exposed surface thereof, and
    (3) forming an impurity region in said semiconductor substrate in a diffusion process by using said hardened photoresist film pattern as a diffusion mask at a temperature higher than a heat resistant temperature of the photoresist film pattern formed in step (1).
2. A method of making a semiconductor device comprising:
    (1) forming a photoresist film pattern within a predetermined pattern on a principal face of a semiconductor substrate,
    (2) hardening said photoresist film pattern by changing the physical property of at least the exposed surface thereof,
    (3) forming a deposition coating film both on said hardened photoresist film pattern and on said semiconductor substrate, and
    (4) removing said hardened photoresist film pattern and said deposition coating film thereon thus providing a pattern of said deposition coating film opposite to that of said photoresist film.
3. The method of making a semiconductor device in accordance with claim 2 including prior to step (1) the step of forming a conductive film under said photoresist film and having a pattern the same as that of said photoresist film.
4. A method of making a semiconductor device comprising the steps of:
    (1) forming a first photoresist film pattern in a predetermined pattern on a principal face of a semiconductor substrate,
    (2) hardening the thus formed photoresist film pattern by changing the physical property of at least the exposed surface thereof,
    (3) forming a deposition coating film both on said hardened photoresist film pattern and on said semiconductor substrate,
    (4) forming a second photoresist film having a pattern opposite to that of said first photoresist film,
    (5) etching away said deposition coating film on said hardened photoresist film pattern using said second photoresist film pattern as an etching mask, and thereafter
    (6) removing said hardened first photoresist film pattern and said second photoresist film pattern.
5. The method of making a semiconductor device in accordance with claim 2 wherein said deposition coating film of $SiO_2$ is applied in step (3) by a chemical vapor deposition method.
6. The method of making a semiconductor device in accordance with claim 2 wherein said deposition coating film is a polycrystalline Si film applied in step (3) by a chemical vapor deposition method.

7. The method of making a semiconductor device in accordance with claim 2 wherein said deposition coating film is a $Si_3N_4$ film applied in step (3) by a chemical vapor deposition method.

8. The method of making a semiconductor device in accordance with claim 2 wherein the hardening of said photoresist film pattern in step (2) is made by heat treating said film at a temperature of about 170°–200° C. in an inert gas.

9. The method of making a semiconductor device in accordance with claim 2 wherein the hardening of said photoresist film pattern in step (2) is made by plasma gas irradiation.

10. The method of making a semiconductor device in accordance with claim 2 wherein the hardening of said photoresist film pattern in step (2) is made by ion implantation.

11. The method of making a semiconductor device in accordance with claim 3 wherein said conductive film has a predetermined pattern of electrodes in contact with a gate, a source region and a drain region formed at said semiconductor substrate.

12. A method of making a semiconductor device comprising the steps of:
   (1) forming a photoresist film in a predetermined pattern on a principal face of a semiconductor substrate,
   (2) hardening said photoresist film pattern by changing the physical property of at least the exposed surface thereof,
   (3) forming an impurity-doped deposition coating film on said hardened photoresist film pattern and said semiconductor substrate,
   (4) diffusing the impurities contained in said impurity-doped deposition coating film into said semiconductor substrate to obtain a diffusion layer using a high temperature heat treatment, and
   (5) removing at least said hardened photoresist film pattern from among the layers formed on said semiconductor substrate.

13. The method of making a semiconductor device in accordance with claim 12 including the additional step of forming a concave portion in said semiconductor substrate by etching away predetermined portions thereof using said photoresist film pattern as an etching mask after said first step.

14. The method of making a semiconductor device in accordance with claim 12 wherein said impurity-doped deposition coating film is a boro-silicate glass film formed in step 3 by a chemical vapor deposition method.

15. The method of making a semiconductor device in accordance with claim 12 wherein said impurity-doped deposition coating film is a phospho-silicate glass film formed in step 3 by a chemical vapor deposition method.

16. The method of making a semiconductor device in accordance with claim 12 wherein the hardening of said photoresist film pattern in step 2 is made by heat treatment at a temperature of about 170°–200° C. in an inert gas.

17. The method of making a semiconductor device in accordance with claim 12 wherein the hardening of said photoresist film pattern in step 2 is made by plasma gas irradiation.

18. The method of making a semiconductor device in accordance with claim 12 wherein the hardening of said photoresist film pattern in step 2 is made by an ion implantation.

19. The method of making a semiconductor device in accordance with claim 12 further comprising the additional step after the fourth step of ion-implanting impurities of a conductivity type opposite to that of said diffusion layer into said diffusion layer, wherein said impurity-doped deposition coating film contains impurities of opposite conductivity type to that of said semiconductor substrate.

20. A method of making a semiconductor device comprising the steps of:
   (1) forming a photoresist film pattern having a predetermined shape on a principal face of a semiconductor substrate,
   (2) hardening the thus applied photoresist film pattern by changing the physical property of at least the exposed surface thereof,
   (3) forming a conductive film over the entire surface of said semiconductor substrate and said hardened photoresist film pattern,
   (4) heat treating the hardened photoresist film pattern to vesicate said hardened photoresist film pattern, and
   (5) removing said vesicated and hardened photoresist film pattern together with said conductive film thereon leaving on said substrate a pattern of said conductive film.

21. The method of making a semiconductor device in accordance with claim 20 wherein said heat treatment step is conducted at a temperature higher than that of step 3.

22. The method of making a semiconductor device in accordance with claim 20 wherein said conductive film is an aluminum film.

23. The method of making a semiconductor device in accordance with claim 20 wherein said photoresist film pattern is hardened by plasma gas irradiation.

24. The method of making a semiconductor device in accordance with claim 20 wherein said photoresist film pattern is hardened by an ion implantation.

25. A method of making a semiconductor device comprising the sequential steps of:
   (1) forming a photoresist film pattern having a predetermined shape on a principal face of a semiconductor substrate,
   (2) hardening said photoresist film pattern by changing the physical property of at least the exposed surface thereof, and
   (3) forming a coating film pattern on said semiconductor substrate at a processing temperature higher than the heat resistant temperature of the photoresist film pattern formed in step 1 prior to said hardening using said hardened photoresist film pattern at a heat treatment step.

26. A method of making a semiconductor device comprising the successive steps of:
   (1) forming a photoresist film pattern having a predetermined shape on a principal face of a semiconductor substrate,
   (2) hardening said photoresist film pattern by changing the physical property of at least the exposed surface thereof, and
   (3) forming an impurity region in said semiconductor substrate by using said hardened photoresist film pattern as a diffusion mask in a diffusion process at a temperature higher than the heat resistant temperature of the photoresist film pattern formed in step 1 before said hardening step.

27. The method of making a semiconductor device in accordance with claim 25 wherein the hardening of said photoresist film pattern in step 2 is carried out by heat treatment in an inert gas at a temperature of about 170° to 200° C.

28. The method of making a semiconductor device in accordance with claim 25 wherein the hardening of said photoresist film pattern in step 2 is carried out by gas plasma irradiation of said organic compound film pattern using a gas selected from the group consisting of He, Ne, Ar, Kr, Xe, $N_2$, $CF_2Cl_2$, $CCl_3F$, $CClF_3$, $CHCl_2F$, $CF_4$, $CCl_4$ and $C_2Cl_6$.

29. The method of making a semiconductor device in accordance with claim 25 wherein the hardening of said photoresist film pattern in step 2 is carried out by ion implantation into said organic compound film pattern of an inert gas selected from the group consisting of He, Ne, Ar, Kr, and Xe.

30. The method of making a semiconductor device in accordance with claim 26 wherein the hardening of said photoresist film pattern in step 2 is carried out by heat treatment in an inert gas at a temperature of about 170° to 200° C.

31. The method of making a semiconductor device in accordance with claim 26 wherein the hardening of said photoresist film pattern in step 2 is carried out by gas plasma irradiation of said organic compound film pattern with a gas selected from the group consisting of He, Ne, Ar, Kr, Xe, $N_2$, $CF_2Cl_2$, $CCl_3F$, $CClF_3$, $CHCl_2F$, $CF_4$, $CCl_4$ and $C_2Cl_6$.

32. The method of making a semiconductor device in accordance with claim 26 wherein the hardening of said photoresist film pattern of step 2 is carried out by ion implantation of an inert gas selected from the group consisting of He, Ne, Ar, Kr and Xe into said organic compound film pattern.

33. The method of making a semiconductor device in accordance with claim 2 wherein the hardening of said photoresist film pattern of step 2 is carried out by gas plasma irradiation on said organic compound film pattern with a gas selected from the group consisting of He, Ne, Ar, Kr, Xe, $N_2$, $CF_2Cl_2$, $CCl_3F$, $CClF_3$, $CHCl_2F$, $CF_4$, $CCl_4$ and $C_2Cl_6$.

34. The method of making a semiconductor device in accordance with claim 2 wherein the hardening of said photoresist film pattern of step 2 is carried out by ion implantation of an inert gas selected from the group consisting of He, Ne, Ar, Kr and Xe into said organic compound film pattern.

* * * * *